United States Patent [19]

Takagi et al.

[11] Patent Number: 5,720,814
[45] Date of Patent: Feb. 24, 1998

[54] PHOTORESIST COATING APPARATUS

[75] Inventors: Motoshi Takagi; Tadashi Nishioka, both of Itami, Japan

[73] Assignees: Mitsubishi Denki Kabushiki Kaisha, Tokyo; Ryoden Semiconductor System Engineering Corporation, Hyogo, both of Japan

[21] Appl. No.: 607,260

[22] Filed: Feb. 21, 1996

[30] Foreign Application Priority Data

Apr. 25, 1995 [JP] Japan ..................... 7-101180

[51] Int. Cl.$^6$ ..................... B05B 13/02
[52] U.S. Cl. ............. 118/319; 118/321; 118/52; 118/315; 239/557
[58] Field of Search ................. 118/320, 321, 118/323, 319, 313, 315, 52; 239/550, 556, 557, 566

[56] References Cited

FOREIGN PATENT DOCUMENTS

| | | |
|---|---|---|
| 0618504 | 10/1994 | European Pat. Off. . |
| 61-238050 | 10/1986 | Japan . |
| 62-195121 | 8/1987 | Japan . |
| 62-221465 | 9/1987 | Japan . |
| 63-301520 | 12/1988 | Japan . |
| 2258082 | 10/1990 | Japan . |
| 555131 | 3/1993 | Japan . |

*Primary Examiner*—Donald E. Czaja
*Assistant Examiner*—Calvin Padgett
*Attorney, Agent, or Firm*—Leydig, Voit & Mayer, Ltd.

[57] ABSTRACT

A supporting plate is disposed above a rotating stage to drive rotatively a semiconductor wafer mounted thereon, and a nozzle fitting rotating disk is secured to the supporting plate rotatively. The rotating center of the nozzle fitting rotating disk is disposed at a position eccentric from a central axis line of the rotating stage. At least one nozzle group in rows composed of a plurality of nozzles for ejecting a photoresist on the semiconductor wafer is fitted to the nozzle fitting rotating disk at intervals in a radial direction of the disk. At least one fitting position of the plurality of nozzles composing nozzle groups is adjustable.

9 Claims, 3 Drawing Sheets

PHOTORESIST COATING APPARATUS

BACKGROUND OF THE INVENTION

1. Field of the Invention

This invention relates to a photoresist coating apparatus for coating a photoresist on a semiconductor wafer for use in the manufacture of a semiconductor integrated circuit device etc., and more particularly, to an improvement of a photoresist coating apparatus for coating a photoresist on a semiconductor wafer using a spin coating technique.

2. Description of the Prior Art

Photoresist coating apparatuses for coating a photoresist on a semiconductor wafer have been heretofore disclosed in Japanese Patent Application Laid-Open Nos. 61-238050, 5-55131, 63-301520, 62-221465, 2-258082 and 62-195121. The apparatuses in those publications were invented to obtain a photoresist film having a flat thickness coated on a semiconductor wafer having a large diameter.

Referring to FIG. 3, Japanese Patent Application Laid-Open No. 61-238050 discloses a photoresist coating apparatus which comprises a chuck table 2 for mounting a semiconductor wafer 1, a spindle 3 for driving rotatively the chuck table 2, an inner nozzle 4, and an outer nozzle 5 located father than the inner nozzle 4 from the center of the chuck table 2 (i.e. outer position in the radial direction). In the foregoing photoresist coating apparatus, the semiconductor wafer 1 is fastened upon the chuck table 2 and rotated together with the chuck table 2 by the spindle 3. During rotating of the semiconductor wafer 1, a photoresist of a low viscosity is dropped down from the outer nozzle 5 on the semiconductor wafer 1, and at the same time, a photoresist of a high viscosity is dropped down from the inner nozzle 4 thereon. Thus, the formation of a photoresist film having a flat thickness on the surface of the semiconductor wafer 1 is attempted.

Japanese Patent Application Laid-Open No. 5-55131 discloses a photoresist coating apparatus in which a photoresist is dropped on a plurality of different portions of a semiconductor wafer from a plurality of nozzles. Specifically, the portions where the photoresist is dropped are located at different distances from the rotational center of the wafer, and the viscosity of the photoresist increases as the distances of the nozzles from the rotational center become large. With the coating apparatus constructed as above, it is tried to get a photoresist film of a uniform thickness.

Japanese Patent Application Laid-Open No. 63-301520 discloses a photoresist coating apparatus which comprises a plurality of nozzles for dropping a photoresist, a positioning mechanism to determine the positions of ejecting positions of the nozzles with respect to the rotational center of a semiconductor wafer, and a moving mechanism to move the ejecting positions of the nozzles freely from the rotational center of the semiconductor wafer toward the outer periphery thereof.

Japanese Patent Application Laid-Open No. 62-221465 discloses a photoresist coating apparatus comprising a centering mechanism locating any of a plurality of nozzles for dropping a photoresist at the center of a semiconductor wafer. The centering mechanism may be composed of a moving member to support a plurality of nozzles, and a driving section to displace the moving member along the diameter of the semiconductor wafer. Alternatively the centering mechanism is composed of a rotational member which supports a plurality of dropping nozzles along the circle passing over the center of a semiconductor wafer and rotates round its circle center.

Japanese Patent Application Laid-Open No. 2-258082 discloses a photoresist coating apparatus wherein a plurality of nozzles are integrated therewith, each of which is capable of ejecting different photoresists on a semiconductor wafer, respectively, and the photoresist is ejected on the semiconductor wafer from the selected one of the plurality of the nozzles to coat the semiconductor wafer with the ejected photoresist.

Japanese Patent Application Laid-Open No. 62-195121 discloses a photoresist coating apparatus wherein a plurality of nozzles for dropping a photoresist are supported by an arm in line from the center of a semiconductor wafer toward the outer periphery of the wafer, and the semiconductor wafer is coated with the same photoresist ejected from the nozzles.

However, the foregoing conventional photoresist coating apparatuses have the following inherent drawbacks.

In Japanese Patent Application Laid-Open No. 61-238050, since the two nozzles 4 and 5 drop two distinct solutions of different viscosities containing the same kind of photoresist, another photoresist coating apparatus is necessary when it is intended to apply a different photoresist for a different semiconductor device and in the different manufacturing process. Therefore, there is a drawback that a semiconductor manufacturing instrument is costly.

In Japanese Patent Application Laid-Open No. 5-55131 as well since the same photoresist is dropped from the plurality of nozzles disposed at different positions from the rotational center of the semiconductor wafer, this apparatus also has the drawback that the semiconductor manufacturing instrument is costly, as in the foregoing Japanese Patent Application Laid-Open No. 61-238050.

In Japanese Patent Application Laid-Open No. 63-301520, although it is possible to automatically switch the photoresist to other photoresists among various kinds of the photoresists, the positioning mechanism and the moving mechanism are complex.

In Japanese Patent Application Laid-Open No. 62-221465, since all the plurality of nozzles for dropping the photoresist are disposed at the rotational center of the semiconductor wafer, it is impossible to drop the plurality of photoresists of the same kind having different viscosities on a plurality of the positions of the semiconductor wafer, and a photoresist film having the uniform thickness can not be obtained on the semiconductor wafer of the large diameter.

Also in Japanese Patent Application Laid-Open No. 2-258082, the plurality of nozzles for ejecting the photoresist are integrated with each other. Although one photoresist of the different kinds having different viscosities could be selectively coated, since the coated positions cannot be adjusted individually due to the integration of the nozzles, plurality of photoresists of the same kind having different viscosities can not be dropped on the desired positions of the semiconductor wafer when any of the nozzles is disposed at the rotational center of the semiconductor wafer. Therefore, a photoresist film having a uniform thickness cannot be formed on a semiconductor wafer of large diameter.

In Japanese Patent Application Laid-Open No. 62-195121, the apparatus is designed such that the plurality of nozzles arranged in alignment for dropping the photoresist are supported by the arm and the same kind of photoresists are coated on the semiconductor wafer. To obtain a photoresist film of a uniform thickness on a semiconductor wafer of a large diameter by applying various kinds of the photoresists, the entirety of the arm having the plurality of nozzles must be replaced with a new one whenever the type of photoresist is changed. Therefore, the photoresist coating operation is troublesome and the operation efficiency is low.

SUMMARY OF THE INVENTION

The present invention is intended to solve the foregoing problems.

It is, accordingly, an object of the present invention to provide a photoresist coating apparatus capable of employing various kinds of photoresists, which is capable of coating a photoresist film of uniform thickness even when the film is formed on a semiconductor wafer having a large diameter, and which is inexpensive and facilitates the coating operation.

The photoresist coating apparatus according to the present invention comprises a rotating stage having a rotating axis to rotate a semiconductor wafer mounted thereon; a nozzle fitting rotating disk having a rotating center disposed eccentrically from the center axis of the rotating shaft of the rotating stage; and at least one nozzle group which is composed of a plurality of nozzles, arranged in alignment, for ejecting a photoresist on the semiconductor wafer; wherein a fitting position of at least one of the plurality of nozzles is adjustable.

In a preferred form, the rotating disk for nozzle fitting comprises through holes equal in number to the nozzles, which are perforated at regular intervals in the radial direction thereof, and the nozzles are fitted to the nozzle fitting rotating disk by insertion into the corresponding through holes.

In another preferred form, the innermost one of the through holes has a slightly larger diameter than that of the nozzle inserted thereinto, and the nozzle is inserted into the innermost through hole to be fitted thereinto.

In a further preferred form, the through holes are of an oval shape, and the nozzles are inserted into the corresponding through holes to be fitted, adjustably in the corresponding through holes, to the nozzle fitting rotating disk with fitting tools.

In a further preferred form, each of the fitting tools is composed of a male screw formed in the tip portion of the nozzle and a pair of nuts engaged with the female screw.

In a further preferred form, each of the oval-shaped through holes is a circular arc, and is disposed so that the through holes cross the concentric circle on the nozzle fitting rotating disk at a predetermined angle without fully overlapping the concentric circle.

In a further preferred form, the through holes comprise a plurality of opening groups which are arranged at intervals in a circumference direction and are arranged from a center of the nozzle fitting rotating disk to an outer periphery thereof radially, and the nozzle groups are arranged corresponding to the plurality of the opening groups.

In a further preferred form, a stopper is provided for stopping the rotation of the nozzle fitting rotating disk relative to the supporting plate and for enabling the disk to keep at least one of predetermined rotating angle positions.

In a preferred form, the supporting plate has a circular hole of a slightly larger diameter than that of the nozzle fitting rotating disk, and the disk is disposed rotatively in the circular hole. In addition, the stopper is composed of a plurality of engaging cavity portions formed in either the nozzle fitting rotating disk or the supporting plate; and an engaging pin accommodated in an engaging pin housing portion formed in either the disk or the plate where the engaging cavity portions are not formed, the pin being pushed so as to engage with one of the engaging cavity portions by pushing means.

BRIEF DESCRIPTION OF THE DRAWINGS

An embodiment of the present invention will now be described by way of example with reference to the accompanying drawings, in which.

DETAILED DESCRIPTION OF THE PREFERRED EMBODIMENTS

An embodiment will now be described with reference to the accompanying drawings in detail.

Figure 1:
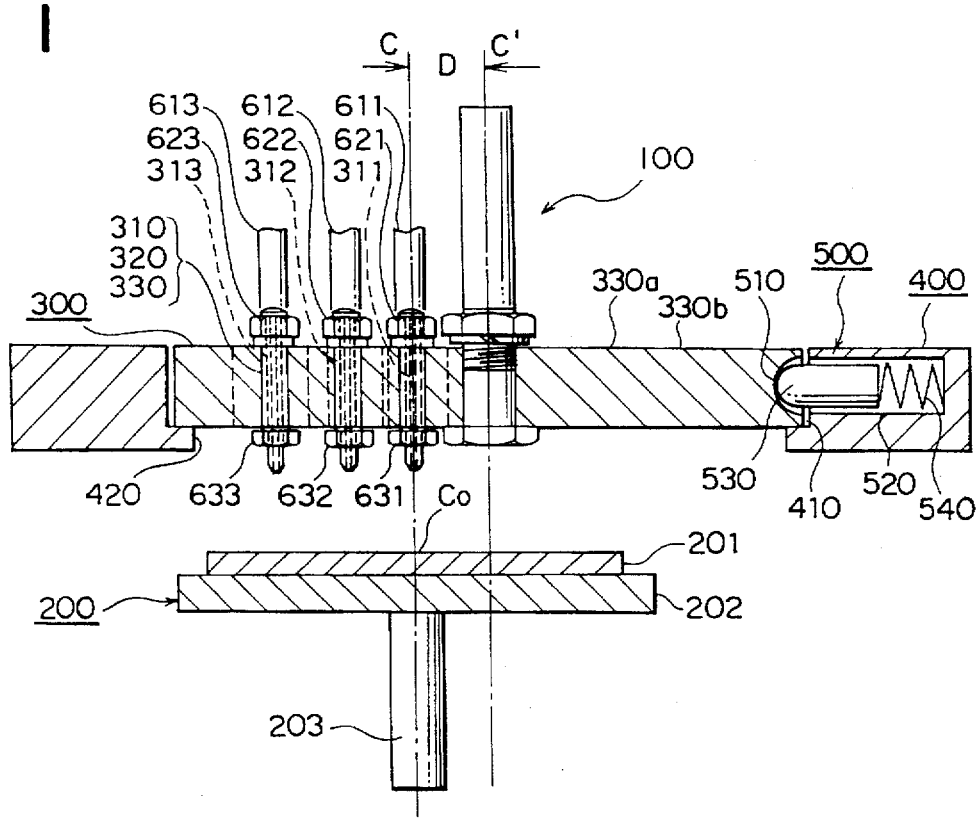
FIG. 1 is a longitudinal sectional view of a photoresist coating apparatus of a preferred embodiment of the present invention.
Figure 2:
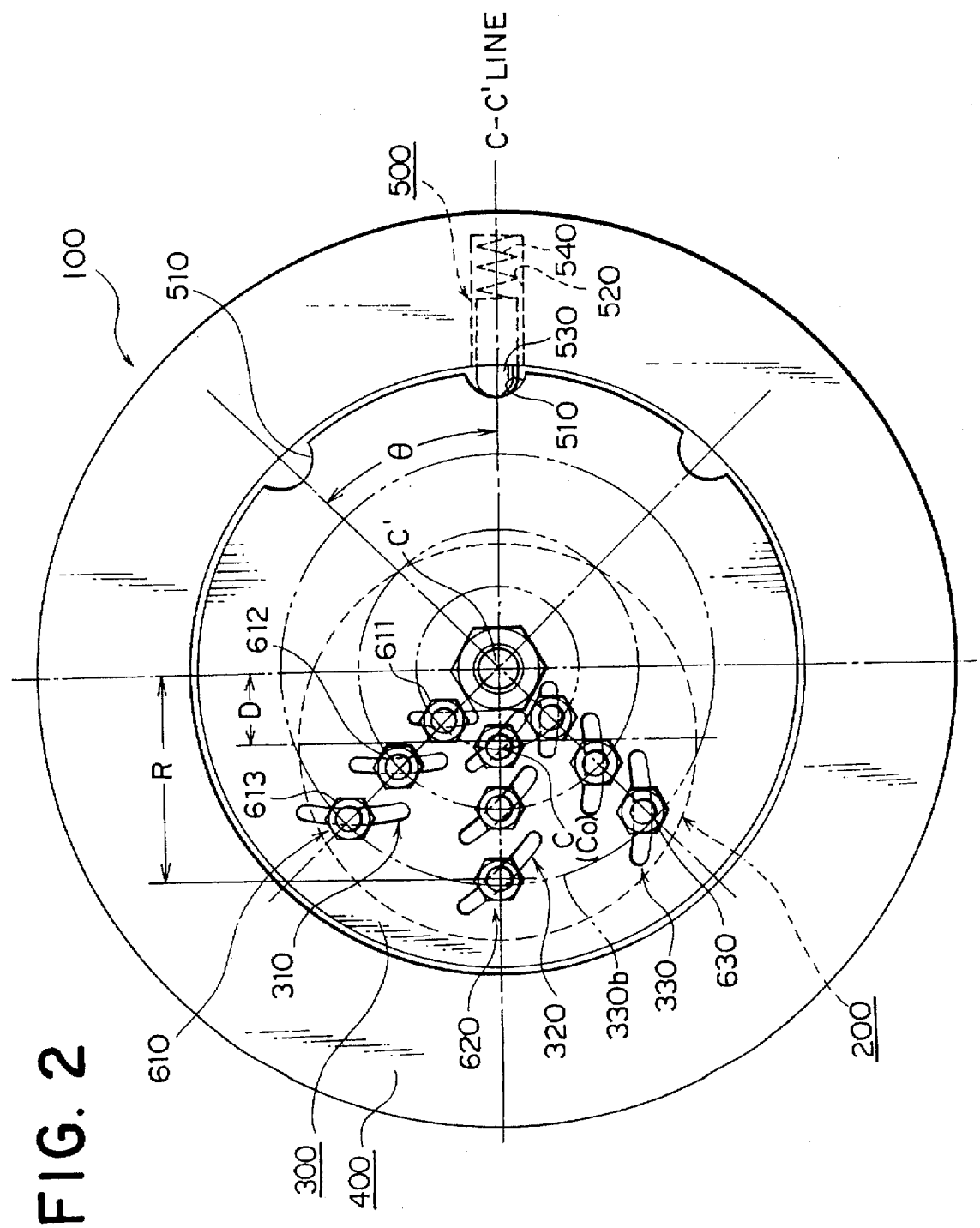
FIG. 2 is a plan view of the photoresist coating apparatus of FIG. 1.
Figure 3:
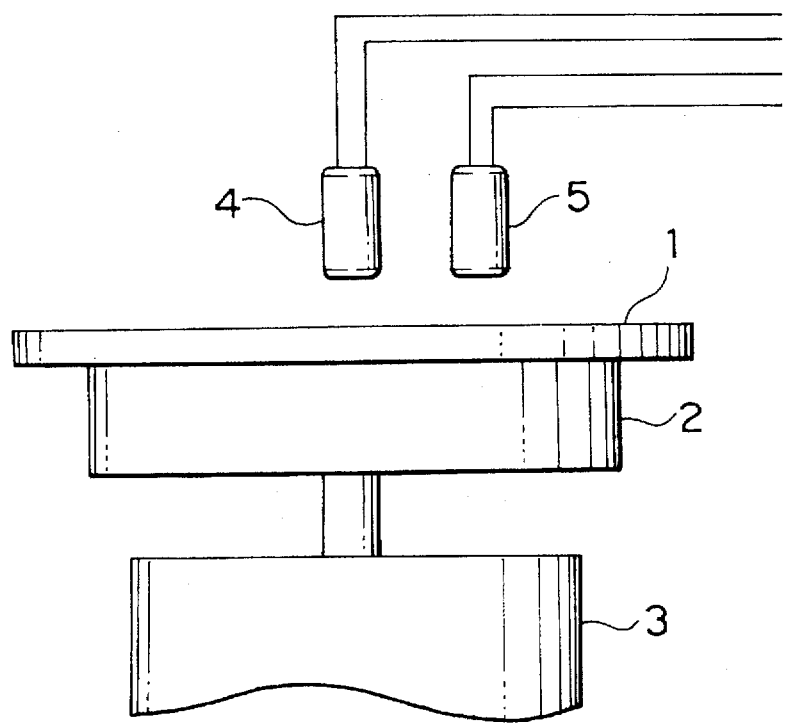
FIG. 3 is a side view showing schematically a conventional photoresist coating apparatus.

FIG. 1 is a longitudinal sectional view showing a photoresist coating apparatus of a preferred embodiment of the present invention, and FIG. 2 is a plan view of the photoresist coating apparatus of FIG. 1.

Referring to FIGS. 1 and 2, in this embodiment, a photoresist coating apparatus 100 is composed of a rotating stage 200 for rotating a semiconductor wafer 201, a nozzle fitting rotating disk 300 for fitting nozzles 611,612, and 613, a supporting plate 400 for supporting the nozzle fitting rotating disk 300, a stopper for fixing the nozzle fitting rotating disk 300 to the supporting plate 400, and at least one sets of nozzle groups 610, 620, and 630 (three set are shown in the figure) fitted to the nozzle fitting rotating disk 300.

The rotating stage 200 comprises a rotating plate 202 for mounting the semiconductor wafer 201, and a rotating shaft 203 having one end fixed to the rotating plate 202, the central axial line C of which coincides with the center of the rotating plate 202, and which is driven rotatively by driving means such as an electric motor (not shown).

The nozzle fitting rotating disk 300 is constructed such that it can rotate round a rotating center C' eccentric with respect to the central axial line C by a predetermined distance D. Furthermore, the nozzle fitting rotating disk 300 is provided with at least one set (three sets in the embodiment shown in the figures) of opening hole groups 310, 320, and 330, each of which is composed of a plurality of through holes 311,312, and 313 disposed at a predetermined interval in a radial direction thereof.

In the example shown in the figures, the through holes 311, 312, and 313 of the respective sets are elongated arcuate through holes which are disposed such that the radial distance from the rotating center C' of the nozzle fitting rotating disk 300 is smallest for the innermost set of through holes and greatest for the outermost set. Moreover, each of the through holes 311, 312, and 313 is so shaped that different points on the arc have different distances from the center C' of rotation of the disk 300. Specifically, the oval-shaped through holes 311, 312, and 313 are arranged so as not to be aligned with concentric circles of the nozzle fitting disk 300, i.e., so as not to be fully overlapped or in parallel with the circles. In other words, the through holes 311, 312, and 313 are arranged so as to cross the concentric circles at an angle.

Furthermore, on the major surface (upper surface) 330a of the nozzle fitting rotating disk 300, scales 330b are concentrically notched at regular intervals in the radial direction from the rotating center C' thereof.

Referring to FIG. 2, the oval-shaped through holes 311, 312, and 313 of each of the nozzle groups 610, 620, and 630 are preferably arranged approximately in parallel with each other, although they need not be arranged in parallel.

The supporting plate 400 is provided with a circular opening 410 having a diameter slightly larger than that of the nozzle fitting rotating disk 300. A projecting peripheral portion 420 extending through the whole circumference of the opening 410 is formed on the bottom surface of the inner periphery. The nozzle fitting rotating disk 300 is inserted into the circular opening 410. The disk 300 is supported rotatively by the projecting peripheral portion 420 formed all over the periphery of the opening 410. The nozzle fitting rotating disk 300 inserted rotatively into the supporting plate 400 is disposed at a position where the rotating center C' thereof is eccentric by a predetermined distance D from the central axial line C of the rotating shaft 203 of the rotating stage 200.

The stopper 500 is composed of a plurality of semispheric pits 510, serving as a plurality of engaging concave portions, formed in the side surface of the nozzle fitting rotating disk 300, a cylindrical pit 520 serving as an engaging pin housing portion extending from the inner surface thereof to the outer side in the radial direction, and formed in the supporting plate 400, an engaging pin 530 having a semispheric tip portion which is capable of engaging with one of the semispheric pits 510 of the nozzle fitting rotating disk 300, and being housed slidably in the cylindrical pit 520; and a pushing spring 540 serving as pushing means for pushing the engaging pin 530 toward the inner side of the radius, and being housed in the cylindrical pit 520 of the supporting disk 400.

The semispheric pits 510 are disposed on the lines through the centers (the longitudinal direction and the center of the axial direction) of the oval-shaped through holes 311, 312, and 313 arranged in parallel with each other, composing each of the opening hole groups 310, 320, and 330, and the center C' of the nozzle fitting rotating disk 300. Specifically, the semispheric pits 510 are disposed, on each of the diameter lines of the nozzle fitting rotating disk 300, at opposite positions to the centers of the oval-shaped through holed 311, 320, and 330 with respect to the center C' of the nozzle fitting rotating disk 300. The above described arrangements of the semispheric pits 510 are preferable. It is not always necessary that the centers of each set of the oval-shaped through holes 311, 312, and 313 and the corresponding semispheric pits 510 be disposed on the diameter lines. However, the distance (angle) between adjacent semispheric pits 510 must be equal to that between the centers of the corresponding oval-shaped through holes 311, 312, and 313 of each of the opening groups 310, 320, and 330.

Supposing that the straight line C-C' connecting the central axial line C of the rotating shaft 203 of the rotating stage 200 to the rotating center C' of the nozzle fitting rotating disk 300 is a reference line, when the nozzle fitting rotating disk 300 rotates from the reference line C-C' to a predetermined angular position (θ), the tip portion of the engaging pin 530, which is being pushed by the pushing spring 540, is plunged into one of the semispheric pits 510 and fitted thereto, so that the relative rotation of the pit 510 and the pin 530 is inhibited.

Furthermore, when the rotating of the nozzle fitting rotating disk 300 is stopped by the stopper 500, a set of the oval-shaped through holes 311,312, and 313 covers almost the radius of the disk 300. Specifically, of two adjacent oval-shaped through holes 311 and 312 or 312, 313, the outer terminals of the holes 311 and 312 are disposed at the positions close to the corresponding inner terminals of the holes 312 and 313, respectively, in a radial direction of the nozzle fitting rotating disk 300. Specifically, these positions are on the same concentrical circles or close to each other. However, they are disposed so as not to be overlapped.

In the nozzle groups 610, 620, and 630, the nozzle closest to the center of the nozzle fitting rotating disk 300 is inserted into the oval-shaped through hole 311 of the inner side, and fitted to the nozzle fitting rotating disk 300 with a fitting tool at a position apart from the rotating center C' of the disk 300 by the distance D. Specifically, the nozzle closest to the center C of the nozzle fitting rotating disk 300 is disposed on the central axial line C' of the rotating axis 203 of the rotating stage 200, that is, on the center Co of the semiconductor wafer 202. The nozzles other than the innermost nozzle are, in the through holes 311, 312, and 313 of the center and outer side, fitted to the nozzle fitting rotating disk 300 with the fitting tools. These nozzles are disposed at such positions that the photoresist film of the uniform thickness is obtained on the semiconductor wafer 201.

Referring to FIG. 1, the structure of the fitting tool is as follows. Each of the nozzles 611, 612, and 613 have the tip portions where the male screws are threaded. The male screws are united with the first nuts 621, 622, and 623. Then, the nozzles 611, 612 and 613 are inserted into corresponding oval-shaped through holes 311, 312, and 313 of the nozzle fitting rotating disk 300. Thereafter, the male screws are further fitted with the second nuts 631, 632, and 633. The nozzle fitting rotating disk 300 is put between the first and second nuts 621, 631: 622, 632: and 623, 633 thereby fixing the nozzles 611, 612, 613 to the disk 300.

Photoresists of the same kind having different viscosities are supplied to one of the nozzle groups 610, 620, and 630 and photoresists of different kinds having different viscosities are supplied to other nozzle groups, from the photoresist supply source (not shown).

As described above, one of the nozzle groups 610, 620, and 630 is positioned at a predetermined photoresist ejecting position, and the photoresist is dropped on the semiconductor wafer 201, rotating the nozzle fitting rotating disk 300. In this situation, by rotating the rotating plate 202 by the driving source such as the motor (not shown) via the rotating shaft 203 of the rotating stage 200, the semiconductor wafer 201 supported fixedly on the rotating plate 202 is rotated together with the rotating plate 202. Hence, the photoresist dropped on the semiconductor wafer 201 is scattered from the central portion to the outer peripheral portion by centrifugal force so that the photoresist film of a uniform thickness is formed on the whole surface of the semiconductor wafer 201.

According to this embodiment, since photoresist supply means is composed of a plurality of combinations of nozzle groups 610, 620, and 630, it is possible to cope with the requirement for coating with various kinds of the photoresists. Switching of one photoresist to other photoresists to be applied can be realized by rotating the nozzle fitting rotating disk 300 relative to the supporting plate 400. Furthermore, after rotating the nozzle fitting rotating disk 300 to a predetermined position (a predetermined angle θ) in the opening hole 410 of the supporting plate 400, the disk 300 stops its rotating by the stopper 500 so that the disk 300 can be kept securely at that position.

Moreover, since the nozzle 611 closer to the rotating center of the nozzle fitting rotating disk 300 is disposed on the central axial line of the rotating axis 203 of the rotating stage 200, that is, on the center of the semiconductor wafer 201, the basic conditions of coating of the photoresist film with uniformity on the semiconductor wafer 201 are fulfilled.

Furthermore, photoresists of the same kinds having different viscosities can be dropped on portions distant from the center of the semiconductor wafer 201 by the central nozzle 612 and nozzle 613 disposed at the outer positions farther out than the inner nozzle 611. It is possible to set the photoresist coating requirements for producing more uniform photoresist film. In addition, the positions where the nozzles 611, 612, and 613 are set can be moved freely within the oval-shaped through holes 311, 312, and 313 so that the radius of the nozzle fitting rotating disk 300 can be substantially covered. Therefore, the nozzles 611, 612, and 613 can be set at any positions.

Furthermore, the scales 330b are concentrically graduated at regular intervals from the rotating center C' on the major surface (main surface) of the nozzle fitting rotating disk 300. If the positions of the nozzles 611, 612, and 613 are varied, it is easy to restore the original positions. Furthermore, on the nozzle fitting rotating disk 300, plural sets of opening groups 310, 320, and 330, each of which has a plurality of oval-shaped through holes 311, 312, and 313 as a set of opening groups, are formed radially. Therefore, the mechanical strength of the nozzle fitting rotating disk 300 is not lowered so much, as compared to the case where a plurality of opening holes extending continuously from the vicinity of the central portion of the disk 300 to the vicinity of the outer periphery thereof are formed radially.

The oval-shaped through holes 311, 312, and 313 may have a rectangular shape. However, when the through holes 311, 312, and 313 are formed so as to be an arc having a curve, the moving distance in the radial direction is shorter when the nozzles 611, 612, and 613 are moved in the arc than when they are moved along a straight line, at the time when the fitting positions of the nozzles 611, 612, and 613 are adjusted within the through holes 311, 312, and 313. Thus, finer adjustments for the nozzles 611, 612, and 613 can be achieved.

The photoresist coating apparatus of the foregoing embodiment of the present invention has a structure such that the plurality of opening hole groups 310, 320, and 330 (three rows) are formed in the nozzle fitting rotating disk 300, and the plurality of nozzle groups 610, 620, and 630 (three rows) are formed in each of the opening hole groups 310, 320, and 330. However, the present invention is not limited to the above structure, and the above described opening hole groups and the nozzle groups may be one row or more than two rows, as occasion demands. In this case, the number of the semi-spherical pits 510 formed in the side surface of the outer periphery of the nozzle fitting rotating disk 300 may be also increased or reduced according to the number of sets (rows) of opening hole groups. Moreover, the intervals (angle θ) between pits adjacent to each other may be varied properly according to the intervals (angle) between the corresponding opening hole groups.

Furthermore, in the case where a plurality of opening groups are formed, the through holes 311 of each of the opening hole groups 310, 320, and 330, formed in the inner portions of the disk 300 close to the center C' of disk 300, are disposed near to each other so that it is difficult to secure a space for the disposition of the through holes 311. When the through hole 311 in the innermost portion of the disk 300 is not oval, but circular, and has a slightly larger diameter than the outer peripheral diameter of the innermost nozzles 611 of each of the nozzle groups 610, 620, and 630, it will be possible to secure the space for the disposition of innermost through holes 311, irrespective of the number of opening hole groups, i.e., nozzle groups. In this case, since it is impossible to finely adjust the fitting position of the innermost through hole 311, it is preferable if the center of the innermost through hole 311 of all of the opening groups is precisely arranged on the circumference of the circle having the radius equal to the distance D from the center C' of the disk 300 to the central axis C' of the rotating stage 200.

In the photoresist coating apparatus of the foregoing embodiment of the present invention, the semi-spherical pits 510 serving as the engaging concave portions are formed in the side surface of the periphery of the nozzle fitting rotating disk 300, and the cylindrical pits 520 serving as engaging pin housing portions are formed in the supporting plate 400. As a matter of course, the locations of these members may be reversed.

As described above, according to the present invention, plural kinds of solutions of different viscosities and, containing the same photoresist can be dropped from the plurality of the nozzles 611, 612, and 613. When coating of other photoresists is intended, other nozzle groups 610, 620, and 630 can be used. Therefore, even when plural kinds of photoresists having different viscosities are coated, it is not required to use a plurality of photoresist coating apparatus in accordance with the kinds of photoresists, etc. as in the conventional apparatus. A single photoresist coating apparatus is sufficient, so a low-priced semiconductor device manufacturing apparatus can be provided.

Moreover, other nozzle groups 610, 620, and 630 can be easily used merely by rotating the nozzle fitting rotating disk 300, and positioning of the nozzles 611, 612, and 613 for the center of the semiconductor wafer 201 and any place can be easily carried out. Thus, many kinds of photoresist can be replaced manually, and the positioning mechanism and moving mechanism can be simplified.

Since the area where the nozzle groups 610, 620, and 630 can be disposed ranges approximately all over the nozzle fitting rotating disk 300, each of the nozzles 611, 612, and 613 can be at any position in the radial direction of the disk 300. Therefore, a plurality of, photoresists formed of the same resist, having different viscosities, can be dropped down on plural positions of the semiconductor wafer 201, thereby obtaining a photoresist film of uniform thickness on a semiconductor wafer 201 of a large diameter.

Furthermore, since the rotating center C of the rotating stage 200 and the center C' of the nozzle fitting rotating disk 300 are disposed eccentrically, a photoresist film of the uniform thickness can be easily formed on a semiconductor wafer 201 of larger diameter by arranging any of the nozzles 611, 612, and 613 on the center of the rotating stage 200, namely, the rotating center C of the semiconductor wafer 201.

The photoresist coating apparatus of the present invention has the following excellent advantages.

By rotating the nozzle fitting rotating disk relative to the supporting plate properly, nozzle ejection positions of the nozzle groups for the semiconductor wafer can be adjusted, and the fitting position of at least one of the nozzles of the nozzle groups can be finely adjusted. Thus, the plurality of nozzles can be positioned at the best photoresist ejection positions individually for a semiconductor wafer of comparatively large diameter, thereby obtaining a photoresist film of the uniform thickness on whole surface of the semiconductor wafer. In addition, the positioning of the nozzles can be very easily carried out with high precision.

Furthermore, by adjusting freely each of the fitting positions (photoresist ejection positions) within the through holes formed at intervals in the radial direction of the nozzle fitting rotating disk, the coating efficiency can be enhanced and a high quality photoresist film of uniform thickness can be easily obtained.

Furthermore, since the innermost one of the through holes is formed so as to be provided with a slightly larger diameter (size) than that of the nozzle inserted thereinto, sufficient space for forming the plurality of through holes for fitting the innermost nozzles can be secured in the vicinity of the center of a nozzle fitting rotating disk having a narrow area. Hence, the plurality of through holes can be easily arranged at the small area in the vicinity of the disk 300.

The plurality of the nozzles can be disposed, with ease, at the best ejection positions individually by moving each of the nozzles within the oval-shaped through holes.

Furthermore, since fine adjustment of the fitting position of the nozzle can be extremely easily conducted, by fastening and loosing the pair of nuts fitted to the male screw in the tip portion of each of the nozzles, the structure of the nozzle position adjustment mechanism can be simplified.

Furthermore, the nozzle is moved in the oval-shaped through hole formed in an arc-shape so that the nozzle can be moved in the radial direction of the nozzle fitting rotating disk bit by bit. Thus, the positioning of the nozzle can be carried out very precisely.

Furthermore, by rotating the nozzle fitting rotating disk, the plurality of the through hole groups arrange in rows radially, namely, the nozzle groups, can be moved toward suitable positions for the photoresist coating sequentially one row by one row. Therefore, a plurality of photoresist films can be formed on the surface of the nozzle fitting rotating disk with very good efficiency by supplying different kinds of photoresists to the plurality of nozzle groups.

Furthermore, after rotating the nozzle fitting rotating disk by a predetermined angle relatively to the supporting plate, the rotating operation of the disk is stopped so that it is supported fixedly at that position with security, thereby preventing positional variation of the nozzle during the coating operation.

Furthermore, the supporting plate comprises a circular hole of a diameter slightly larger than that of the nozzle fitting rotating disk, and the nozzle fitting rotating disk is disposed rotatively in the circular hole. The stopper is composed of the plurality of engaging cavity portions formed in either nozzle fitting rotating disk or supporting plate, and the engaging pin accommodated in the engaging pin housing portion formed in either the disk or the plate where the engaging cavity portions are not formed, the pin being pushed so as to engage with one of the engaging cavity portions by the pushing means. Therefore, the structure of the moving and stopping mechanism for the nozzle groups is simplified.

Although only one embodiment of the present invention has been disclosed and described, it is apparent that other embodiments and modifications of the present invention are possible.

What is claimed is:

1. A photoresist coating apparatus comprising:

a rotating stage having a rotating axis to rotate a semiconductor wafer mounted thereon;

a supporting plate disposed above said rotating stage;

a nozzle fitting rotating disk rotatably supported by said supporting plate, a rotating center of said disk being disposed at a position eccentric from a central axis line of a rotating axis of said rotating stage; and at least one nozzle group comprising a plurality of nozzles disposed in a row on the disk to eject a photoresist on said semiconductor wafer;

wherein a fitting position on the disk of at least one of the nozzles is adjustable.

2. The apparatus according to claim 1, wherein said nozzle fitting rotating disk has a plurality of through holes formed at intervals in a radial direction thereof, and each of said nozzles is mounted in one of the through holes.

3. The apparatus according to claim 2, wherein the innermost one of said through holes has a slightly larger diameter than that of the nozzle mounted therein.

4. The apparatus according to claim 2, wherein said through holes are oval-shaped, and each of said nozzles is fitted to said nozzle fitting rotating disk by a fitting member, the fitting positions of each of said nozzles in said oval-shaped through holes being adjustable.

5. The apparatus according to claim 4, wherein each of said fitting members comprises a male screw and a pair of nuts engaged with said male screw.

6. The apparatus according to claim 4, wherein said oval-shaped through holes are arc-shaped, and are disposed so as to cross, at an angle, circles concentric with the center of said nozzle fitting rotating disk.

7. The apparatus according to claim 2, wherein said through holes comprise a plurality of groups disposed at intervals in a circumferential direction of the disk, each group comprising a plurality of the through holes arranged in a row extending radially from the center of said nozzle fitting rotating disk.

8. The apparatus according to claim 1, further comprising:

a stopper positioned and arranged to stop rotation of the nozzle fitting rotating disk relative to the supporting plate at at least one rotational position.

9. The apparatus according to claim 8, wherein said supporting plate has a hole in which the nozzle fitting rotating disk is rotatably disposed, and the stopper comprises a cavity formed in either of the disk or the supporting plate and a pin formed in the other of the disk or supporting plate with the pin being biased towards the cavity to enable engagement between the pin and the cavity.

* * * * *